(12) United States Patent
Nakahara et al.

(10) Patent No.: US 7,741,637 B2
(45) Date of Patent: Jun. 22, 2010

(54) ZNO-BASED SEMICONDUCTOR DEVICE

(75) Inventors: Ken Nakahara, Kyoto (JP); Hiroyuki Yuji, Kyoto (JP); Kentaro Tamura, Kyoto (JP); Shunsuke Akasaka, Kyoto (JP); Masashi Kawasaki, Miyagi (JP); Atsushi Tsukazaki, Miyagi (JP); Akira Ohtomo, Miyagi (JP)

(73) Assignee: Rohm Co., Ltd., Kyoto-fu (JP)

( * ) Notice: Subject to any disclaimer, the term of this patent is extended or adjusted under 35 U.S.C. 154(b) by 31 days.

(21) Appl. No.: 12/308,064

(22) PCT Filed: Jun. 8, 2007

(86) PCT No.: PCT/JP2007/061662

§ 371 (c)(1),
(2), (4) Date: Dec. 5, 2008

(87) PCT Pub. No.: WO2008/004405

PCT Pub. Date: Jan. 10, 2008

(65) Prior Publication Data

US 2009/0200545 A1    Aug. 13, 2009

(30) Foreign Application Priority Data

Jun. 8, 2006    (JP) ............................. 2006-160273

(51) Int. Cl.
*H01L 29/22*    (2006.01)
(52) U.S. Cl. ................. 257/43; 257/E29.094
(58) Field of Classification Search ............ 257/43, 257/E29.094

See application file for complete search history.

(56) References Cited

U.S. PATENT DOCUMENTS 6,674,098 B1 * 1/2004 Niki et al. ................ 257/102

(Continued)

FOREIGN PATENT DOCUMENTS

JP    2004-235794    8/2004

(Continued)

OTHER PUBLICATIONS

Atsushi Tsukazaki et al.: "Repeated temperature modulation epitaxy for p-type doping and light-emitting diode based on ZnO," Nature Materials, Published online (www.nature.com/naturematerials): Dec. 19, 2004, pp. 1-5.

(Continued)

*Primary Examiner*—Matthew Smith
*Assistant Examiner*—Walter H Swanson
(74) *Attorney, Agent, or Firm*—Rabin & Berdo, PC

(57) ABSTRACT

Provided is a ZnO-based semiconductor device capable of growing a flat ZnO-based semiconductor layer on an MgZnO substrate having a main surface on the lamination side oriented in a c-axis direction. ZnO-based semiconductor layers 2 to 6 are epitaxially grown on an $Mg_xZn_{1-x}O$ ($0 \leqq x<1$) substrate 1 having a +C surface (0001), as a main surface, inclined at least in an m-axis direction. A p-electrode 8 is formed on the ZnO-based semiconductor layer 5, and an n-electrode 9 is formed on the underside of the $Mg_xZn_{1-x}O$ substrate 1. Thereby, steps regularly arranged in the m-axis direction can be formed on the surface of the $Mg_xZn_{1-x}O$ substrate 1, and a phenomenon called step bunching is prevented. Consequently, the flatness of a film of the semiconductor layers laminated on the substrate 1 can be improved.

4 Claims, 16 Drawing Sheets

U.S. PATENT DOCUMENTS

2004/0227150 A1  11/2004  Nakahara
2005/0208687 A1   9/2005  Kasai et al.
2005/0242357 A1  11/2005  Uematsu et al.

FOREIGN PATENT DOCUMENTS

| | | |
|---|---|---|
| JP | 2004-304166 | 10/2004 |
| JP | 2005-298319 | 10/2005 |
| JP | 2005-340765 | 12/2005 |

OTHER PUBLICATIONS

K. Nakahara et al.: "Growth of N-doped and Ga+N-codoped ZnO films by radical source molecular beam epitaxy," Journal of Crystal Growth 237-239 (2002), pp. 503-508.

* cited by examiner (a)

(b)

(c)

(a)

(b)

(a)

(b)

(c)

(d)

(a)

(b)

(a)

(b)

(a)

(b)

(a)

(b)

(a)

(b)

(a)

(b)

(c)

(a)

(b)

ZNO-BASED SEMICONDUCTOR DEVICE

TECHNICAL FIELD

The present invention relates to a ZnO-based semiconductor device using ZnO-based semiconductors such as ZnO and MgZnO.

BACKGROUND ART

In recent years, a ZnO-based semiconductor has been drawing attention as a material having higher multifunctionality than a nitride-based semiconductor containing nitrogen such as GaN, AlGaN, InGaN, InGaAlN, and GaPN.

The ZnO-based semiconductor is one of the wide-gap semiconductors, and has the following characteristics: having a markedly large exciton binding energy; being capable of existing stably at room temperature; being capable of emitting photons having excellent monochromaticity; and the like. Because of these characteristics, the ZnO semiconductor has been put into practical use as a material for: an ultraviolet LED used as a light source for lighting, backlighting, and the like; a high-speed electronic device; a surface-acoustic-wave device; and the like.

It is known, however, that a defect or the like may arise in such a ZnO-based semiconductor due to oxygen vacancies and interstitial zinc atoms. Such a crystal defect generates non-contributing electrons in the crystal, thereby causing the ZnO semiconductor to normally exhibit the n-type property. In order to obtain a p-type ZnO semiconductor, the concentration of the residual electrons needs to be decreased, and it is difficult to perform acceptor doping when a semiconductor device is formed by ZnO-based semiconductor layers. It is therefore difficult to form a p-type ZnO with good reproducibility.

However, it has been made possible to obtain a p-type ZnO that has good reproducibility, and light emission has been observed. Techniques of obtaining such a p-type ZnO are having been disclosed. For example, a p-type ZnO can be obtained as shown in Non-patent Document 1. In this technique, in order to obtain a semiconductor device using a ZnO semiconductor, a ScAlMgO$_4$ (SCAM) substrate is used as a growth substrate, and −C surface ZnO is grown on a C surface of the SCAM substrate. The −C surface is also called an O (oxygen) polar surface. The wurtzite crystal structure that a ZnO crystal has no symmetry in the c-axis direction. The c-axis direction has two independent directions: +c and −c. The +c direction is also called a Zn polarity because Zn is located on the uppermost surface of the crystal in the +c direction; the −c direction is also called an O polarity because O is located on the uppermost surface of the crystal in the −c direction.

This −C surface ZnO is similarly grown on a sapphire substrate widely used as a ZnO crystal growth substrate. As shown in Non-patent Document 2 described by the inventors, in the crystal growth of a −C surface ZnO-based semiconductor, since the efficiency of doping nitrogen, which is a p-type dopant, depends largely on the growth temperature, the substrate temperature needs to be decreased to perform the nitrogen doping. However, decreasing the substrate temperature degrades the crystallinity, and then causes a carrier compensation center to be formed which compensates an acceptor nitrogen. Since nitrogen is therefore not activated, the formation itself of a p-type ZnO-based semiconductor layer is extremely difficult in the crystal growth of a −C surface ZnO-based semiconductor.

In this regard, as shown in Non-patent Document 1, there is a method which utilizes the dependency of the nitrogen doping efficiency on temperature. In the method, a p-type ZnO-based semiconductor layer having high carrier concentration is formed through temperature modulation in which the growth temperature is modulated between 400° C. and 1000° C. However, since the repetition of expansion and contraction due to the successive heating and cooling processes puts a heavy strain on a manufacturing apparatus, a large scale manufacturing apparatus is required. The method also causes a problem of requiring short maintenance cycle for the manufacturing apparatus. Moreover, a laser, which is not suitable for heating a large area, is used as a heating source. Accordingly, it is difficult to perform multiple-wafer growth to reduce device manufacturing cost.

As a measure for solving the above problems, we have already proposed a technique to form a p-type ZnO-based semiconductor having high carrier concentration by growing a +C surface ZnO-based semiconductor layer (refer to Patent Document 1). This patent publication is based on our finding that, in +C surface ZnO, the nitrogen doping has little dependency on the substrate temperature. In this technique, a +C surface GaN film to be a base layer is grown on the C surface of a sapphire substrate so as to be oriented in the +c-axis direction. Then, a +c-axis oriented ZnO-based semiconductor layer is formed on the +c-axis oriented GaN film, while inheriting the polarity of the +c-axis oriented GaN film. In this way, we have found out the non-dependency of the nitrogen doping on the growing temperature. Accordingly, the nitrogen doping can be carried out without reducing the substrate temperature, and as a result, the formation of the carrier compensation center can be prevented. A p-type ZnO-based semiconductor having high carrier concentration can thus be manufactured.

Patent Document 1: Japanese Patent Application Publication 2004-304166
Non-patent Document 1: Nature Materials vol. 4 (2005) p. 42
Non-patent Document 2: Journal of Crystal Growth 237-239 (2002) 503

DISCLOSURE OF THE INVENTION

Problems to be Solved by the Invention

A p-type ZnO-based semiconductor having high carrier concentration can thus be manufactured by forming the +C-axis oriented ZnO-based semiconductor layer by use of the conventional technique described above, namely, by use of a +C surface GaN of a growth substrate. However, since this method is characterized by suppression of oxidation of the surface of the +C surface GaN, it is difficult to ensure the reproducibility of ZnO which is an oxide. Meanwhile, a +C surface ZnO substrate may be used as the growth substrate for forming the +C-axis oriented ZnO-based semiconductor layer. However, since the +C surface of ZnO substrates is more thermally unstable than the −C surface, the flatness of the +C surface is likely to be lost. If crystal growth is carried out on the +C surface ZnO substrate, a phenomenon called a step bunching occurs, in which different sized surface-terraces are formed so that the widths of the flat portions are not the same.

Parts (a) and (b) of FIG. 18 are images of the −C surface of the growth substrate and the +C surface of the growth substrate, respectively, each being obtained by scanning the surface, having been annealed at 1000° C. in the atmosphere, in 5 μm of resolution by using an AFM (atomic force microscope). The crystal shown in Part (a) of FIG. 18 has a neatly formed surface, whereas in Part (b) of FIG. 18, the surface condition is poor. Specifically, in Part (b) of FIG. 18, the step bunching is caused, and step widths and step edges are distorted. If, for example, a ZnO-based compound is epitaxially grown on the surface of Part (b) of FIG. 18, the ZnO-based compound would be a film having unevenness throughout as shown in FIG. 19, and the flatness would be extremely poor.

As described above, it is difficult to grow a film flatly on the +C surface of the growth substrate. Accordingly, there has been a problem of ultimately reducing the quantum efficiency of the device and affecting the switching speed of the device.

The present invention has been created to solve the above problems, and an object thereof is to provide a ZnO-based semiconductor device capable of growing a ZnO-based semiconductor layer flatly on an MgZnO substrate a main surface on a lamination side of which is oriented in a +c-axis direction.

Means for Solving the Problems

To achieve the above object, the invention described in claim 1 is a ZnO-based semiconductor device, characterized in that in an $Mg_xZn_{1-x}O$ ($0 \leq x < 1$) substrate having a C surface as its main surface, a c-axis is inclined by $\Phi_m$ degree at least in an m-axis direction, the $\Phi_m$ satisfies a condition being $0 < \Phi_m \leq 3$, and a ZnO-based semiconductor layer is formed on the main surface.

In addition, the invention described in claim 2 is the ZnO-based semiconductor device according to claim 1, characterized in that a +C surface constitutes the C surface.

In addition, the invention described in claim 3 is the ZnO-based semiconductor device according to any one of claims 1 and 2, characterized in that the c-axis of the main surface is inclined by $\Phi_a$ degree in an a-axis direction, and the $\Phi_a$ satisfies a condition of $70 \leq \{90 - (180/\pi)\arctan(\tan \Phi_a / \tan \Phi_m)\} \leq 110$.

EFFECTS OF THE INVENTION

According to the present invention, the c-axis of the main surface of the MgZnO substrate is inclined at least in the m-axis direction, and an angle by which the c-axis is inclined in the m-axis direction is set to be 2° or less. Thereby, steps arranged regularly in the m-axis direction can be formed on the lamination side surface of the $Mg_xZn_{1-x}O$ substrate. This prevents a phenomenon called the step bunching, and improves the film flatness of each of the ZnO-based semiconductor layers laminated on the $Mg_xZn_{1-x}O$ substrate.

In addition, when the c-axis of the main surface of the MgZnO substrate is inclined also in the a-axis direction, the inclination angle is set in a certain range. Thereby, steps formed on a growth substrate of the MgZnO substrate are arranged in the m-axis direction. This improves the film flatness of the ZnO-based semiconductor grown on the main surface.

EXPLANATION OF REFERENCE NUMERALS

1 $Mg_xZn_{1-x}O$ SUBSTRATE
2 N-TYPE LAYER
3 ACTIVE LAYER
4 P-TYPE LAYER
5 P-TYPE CONTACT LAYER
6 LIGHT EMITTING LAYER FORMATION PART
7 SEMICONDUCTOR LAMINATION PART
8 P-ELECTRODE
9 N-ELECTRODE
21 ZnO SUBSTRATE
23 UNDOPED ZnO LAYER
24 N-TYPE MgZnO ELECTRON TRANSIT LAYER

BEST MODE FOR CARRYING OUT THE INVENTION

Figure 1:
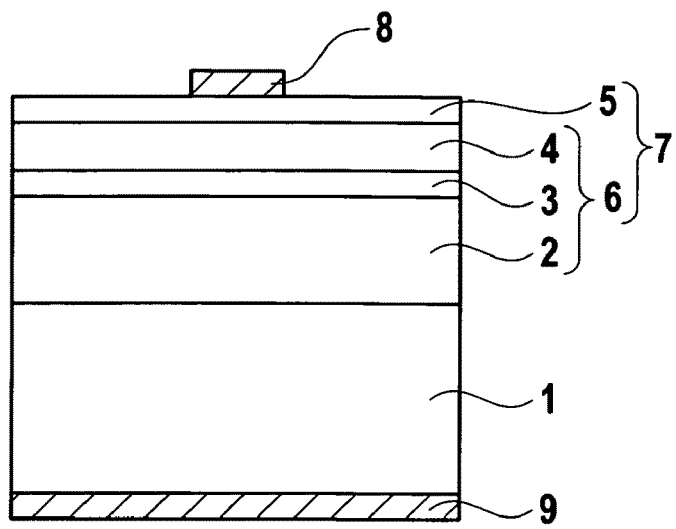
FIG. 1 is a diagram showing an example of a cross-section structure of a ZnO-based semiconductor device according to the present invention.

An embodiment of the present invention will be described below with reference to the drawings. FIG. 1 shows a cross-section structure of a ZnO-based semiconductor device of the present invention.

FIG. 1 shows a cross-section structure of a light-emitting diode (LED) being the embodiment of the ZnO-based semiconductor device of the present invention. ZnO-based semiconductor layers 2 to 6 are epitaxially grown on an $Mg_xZn_{1-}$ $_x$O ($0 \leq x < 1$, or preferably, $0 \leq x < 0.5$, the same applies hereinafter) substrate 1 the main surface of which is a +C surface (0001) being inclined at least in an m-axis direction. A p-electrode 8 is formed on the ZnO-based semiconductor layer 5, and an n-electrode 9 is formed on the underside of the $Mg_xZn_{1-x}O$ substrate 1. The ZnO-based semiconductor layers are formed of ZnO or a compound containing ZnO; therefore, the entire ZnO-based semiconductor device above is formed of ZnO or a compound containing ZnO, except for the electrodes 8 and 9.

Figure 2:
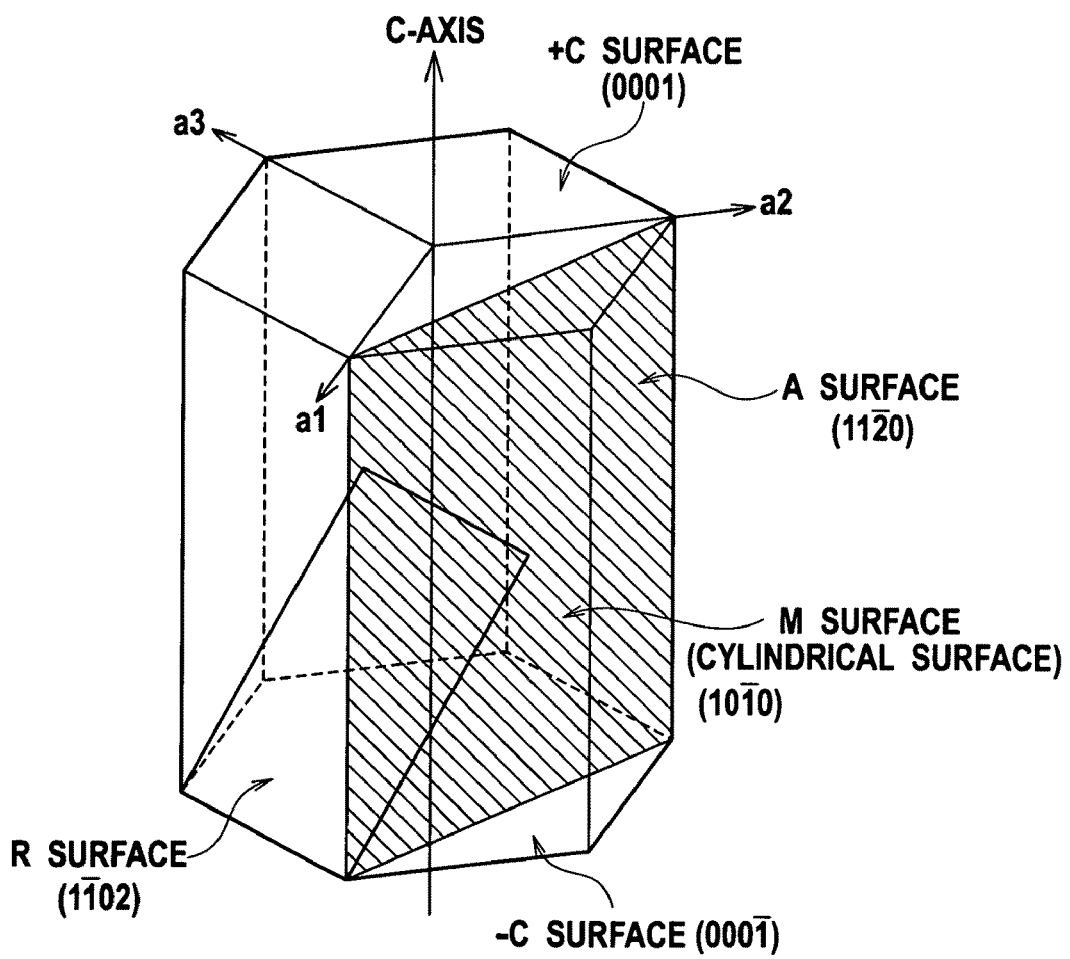
FIG. 2 is a conceptual diagram of a crystal structure of a ZnO-based compound.

Now, FIG. 2 is a conceptual diagram showing a crystal structure of a ZnO-based compound such as $Mg_xZn_{1-x}O$ described above. Like GaN, a ZnO-based compound has a hexagonal structure called wurtzite. Expressions such as a C surface and an a-axis can be expressed using a so-called mirror index. For example, the C surface is expressed as a (0001) surface. In FIG. 2, the surface with diagonal lines is an A-surface (11-20), and an M-surface (10-10) represents a cylindrical surface of the hexagonal structure. Because of the symmetric property that the crystal has, the A-surface {11-20} and the M-surface {10-10} for example, are general terms respectively including surfaces symmetry-equivalent to the (11-20) surface and surfaces symmetry-equivalent to the (10-10) surface. In addition, an a-axis, an m-axis, and a c-axis show a vertical direction to the A surface, the M surface, and the C surface, respectively.

The $Mg_xZn_{1-x}O$ substrate 1 to be a base of crystal growth may be ZnO in which x=0, or may be an MgZnO substrate in which Mg is mix-crystallized. It is not preferable to mix more than 50 wt % of Mg because then it becomes difficult for MgO, which is a NaCl crystal, to be commensurate with the ZnO-based compound, and accordingly the MgO and the ZnO-based compound tend to be separated from each other.

Figure 3:
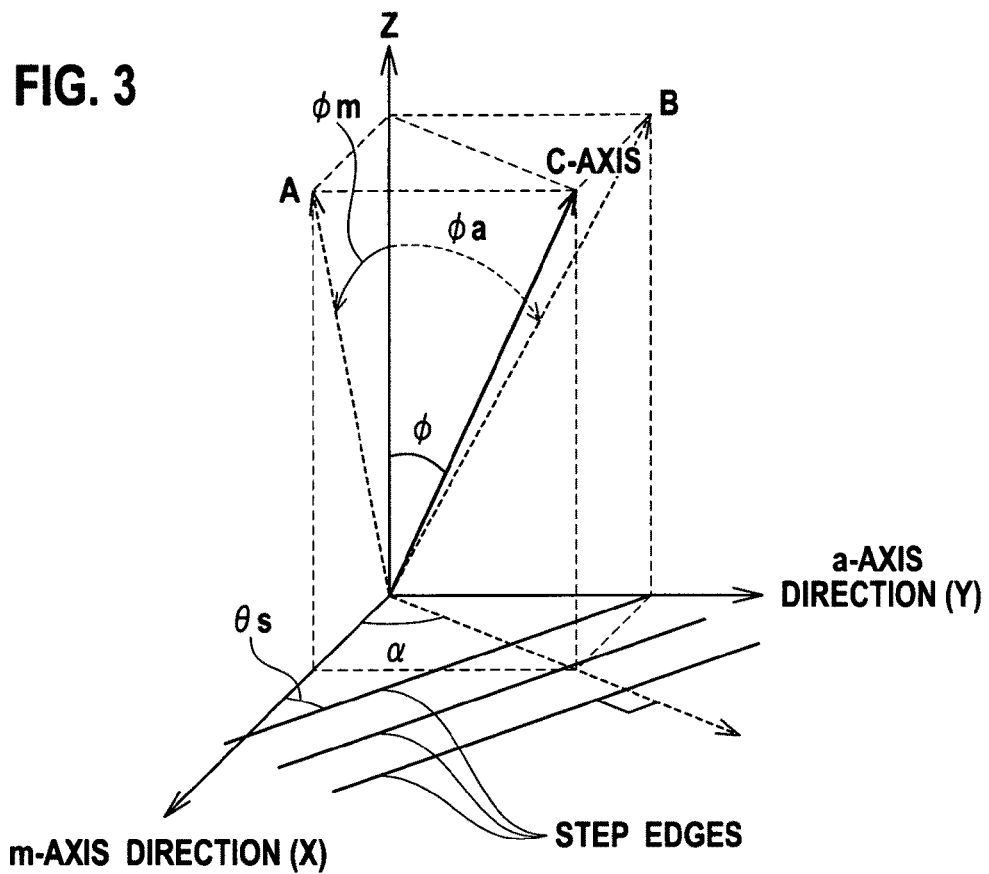
FIG. 3 is a diagram showing an inclination state of a c-axis of an $Mg_xZn_{1-x}O$ substrate surface.

As shown in FIG. 3, the $Mg_xZn_{1-x}O$ substrate 1 is polished so that the +C surface being the main surface may be a surface inclined at least in the m-axis direction. FIG. 3 expresses the entire surface of the substrate 1 with an X-Y plane, and shows relationships between the substrate 1 and the c-axis direction, m-axis direction, and a-axis direction, respectively. A vertical direction to the surface of the substrate 1 is set to be the Z-axis. Further, the m-axis direction corresponds to the X-axis, and the a-axis direction corresponds to the Y-axis. Accordingly, the m-axis and the a-axis are orthogonal to each other. Furthermore, an angle formed by the Z-axis and the c-axis is set as $\Phi$, an inclination angle component of the c-axis in the m-axis direction is set as $\Phi_m$, and an inclination angle component of the c-axis in the a-axis direction is set as $\Phi_a$.

Figure 5:
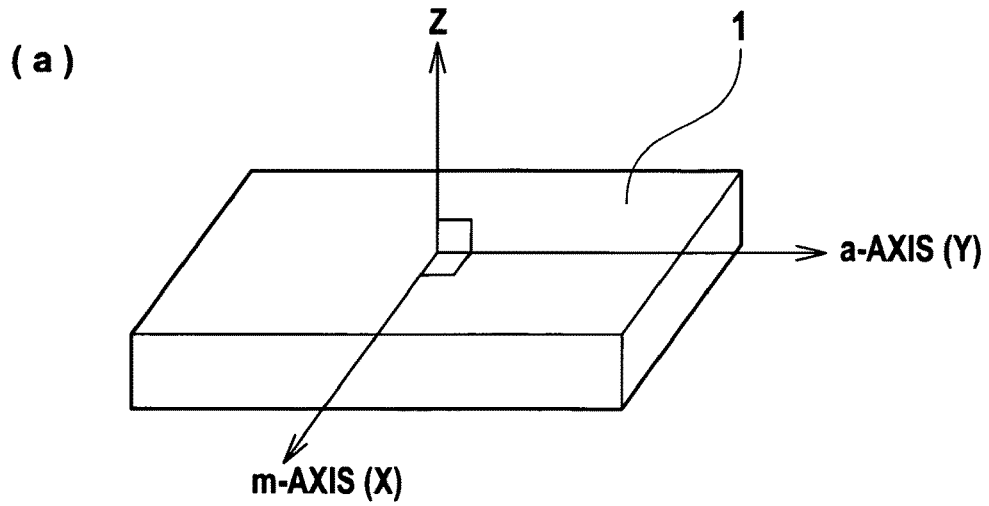
FIG. 5 is a diagram showing the $Mg_xZn_{1-x}O$ substrate surface in which the c-axis has an off-angle only in an m-axis direction.
Figure 5:
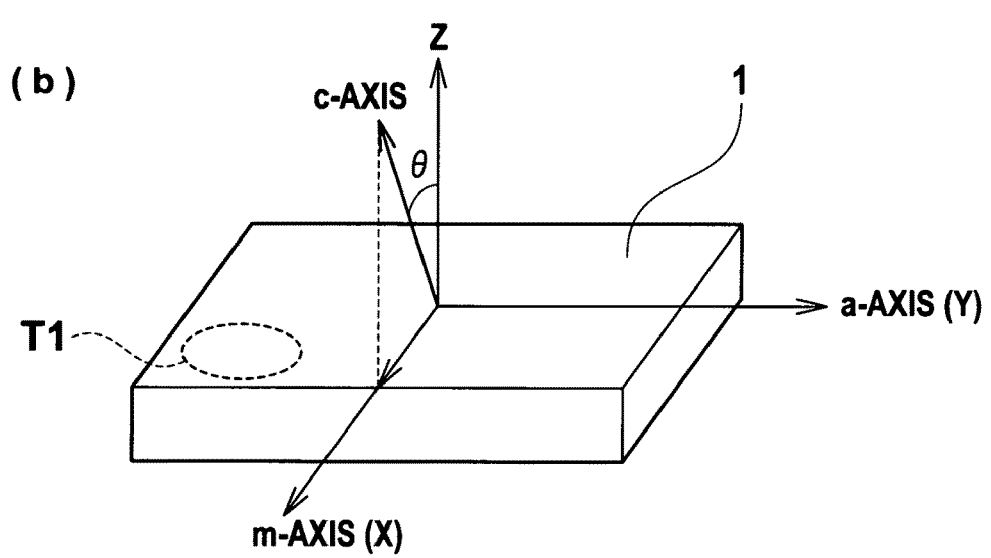
Figure 5:
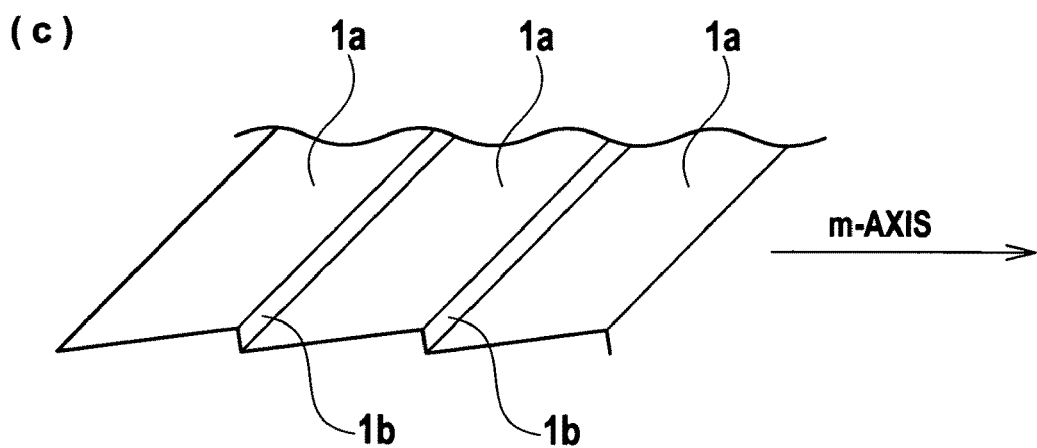

Now, description will be given of the reason why the c-axis of the main surface is inclined in the m-axis. Part (a) of FIG. 5 shows a schematic diagram showing a substrate in which, with the main surface being the +C surface, the C surface is inclined neither in the a-axis, nor in the m-axis. The diagram shows a case where the vertical direction Z of the substrate 1 coincides with the +c-axis direction, and the a-axis, the m-axis, and the c-axis are orthogonal to each other.

However, in a bulk crystal, the normal direction of the wafer surface does not coincide with the c-axis direction as shown in Part (a) of FIG. 5 unless the cleavage surface of the crystal is used. Accordingly, trying to manufacture a substrate having no off-angle with respect to the C surface results in poor productivity. In actuality, the c-axis has an off-angle, inclined from the normal direction (Z-axis) of the wafer surface. For example, as shown in Part (b) of FIG. 5, if the c-axis direction of the main surface is inclined by θ° in the m-axis only, for example, terrace surfaces 1a and step surfaces 1b are formed as shown in Part (c) of FIG. 5 which is an enlarged view of a surface portion (T1 region, for example) of the substrate 1. The terrace surfaces 1a are flat surfaces, and the step surfaces 1b are formed at regular intervals at step portions formed by the inclination.

Here, the terrace surfaces 1a correspond to the C surface (0001), and the step surfaces 1b correspond to the M-surface (10-10). As shown in the drawing, the step surfaces 1b are regularly arranged while keeping the widths of the terrace surfaces 1a in the m-axis direction. In other words, the terrace surfaces 1a are not parallel to, but inclined from the X-Y plane, and the c-axis perpendicular to the terrace surfaces 1a is inclined from the Z-axis by θ°.

Figure 4:
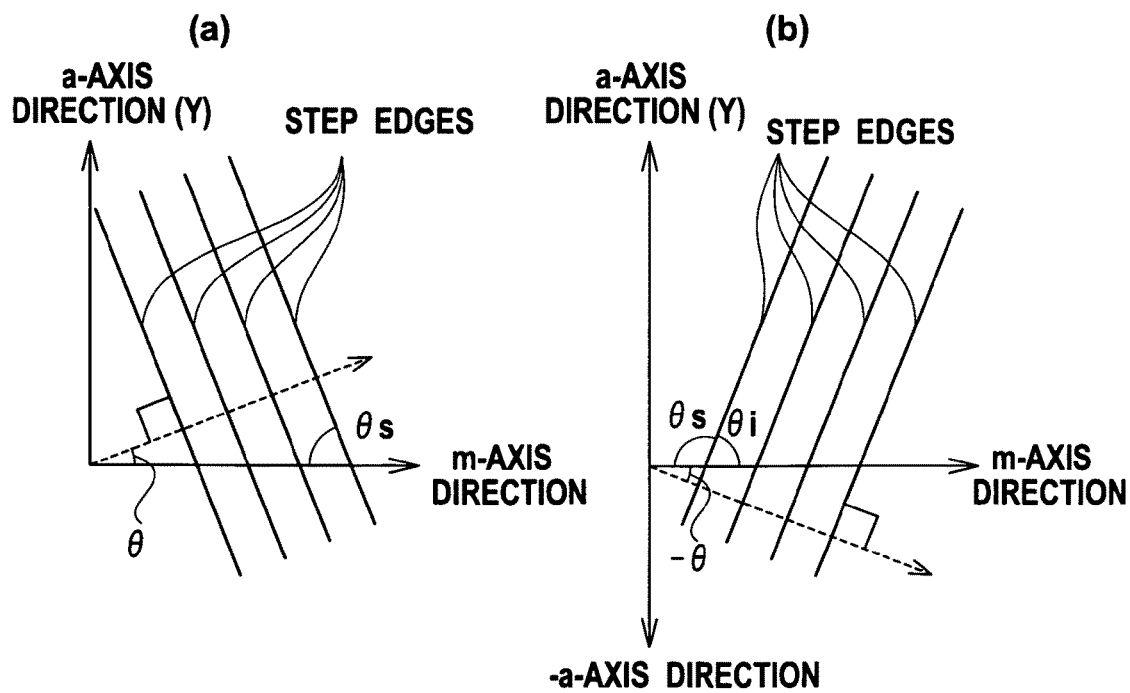
FIG. 4 is a diagram showing a relationship between step edges and an m-axis.

The state shown in Part (c) of FIG. 5 corresponds to a case where $\theta_s$=90° in FIGS. 3 and 4. The step edges shown FIGS. 3 and 4 are what the step portions formed by the step surfaces 1b are projected on the X-Y plane. Having the step surfaces correspond to the M surface renders it possible to make the ZnO-based semiconductor layers crystal-grown on the main surface a flat film. The step portions are formed on the main surface by the step surfaces 1b. Incoming atoms on each step portion are bonded to the two surfaces: the terrace surface 1a and the step surface 1b. As a result, the atoms can be bonded stronger than coming on the terrace surface 1a, and therefore, the incoming atoms can be stably trapped.

Figure 15:
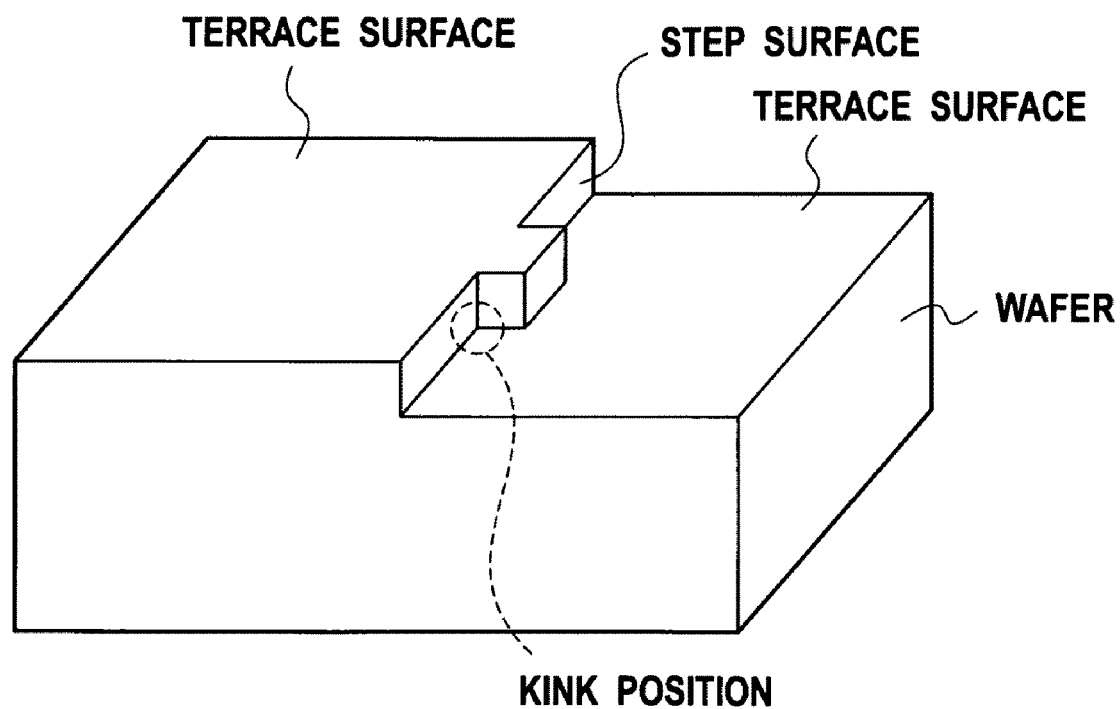
FIG. 15 is a diagram showing a kink position on a wafer in a crystal growth process.

The incoming atoms diffuse in the terrace during a surface diffusion process. A stable growth is accomplished by a lateral growth in which crystal growth is promoted by trapping the atoms in the step portions allowing strong bonding and in kink positions (see FIG. 15) formed at the step portions and by thus incorporating the atoms in the crystal. In this way, when the ZnO-based semiconductor layers are laminated on the substrate in which the C surface is inclined at least in the m-axis direction, the crystal is grown particularly on these step surfaces. As a result, the ZnO-based semiconductor layers can be made a flat film.

Figure 9:
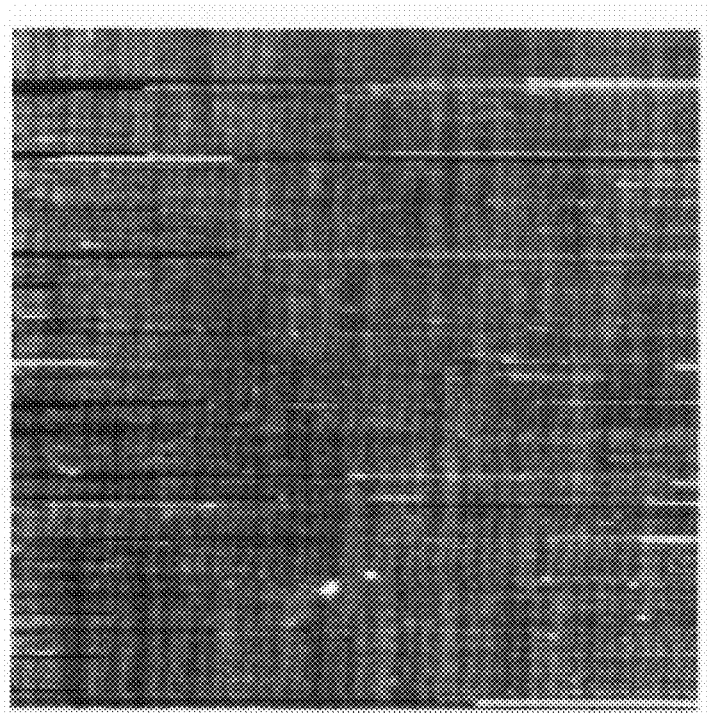
FIG. 9 is a view showing the surface of a film formed on the $Mg_xZn_{1-x}O$ substrate in which the c-axis has an off-angle in the m-axis direction.
Figure 10:
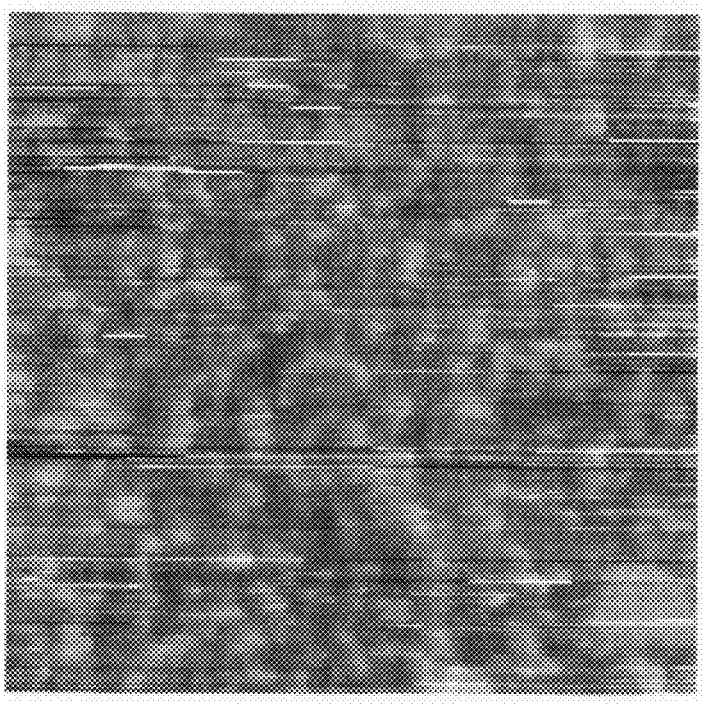
FIG. 10 is a view showing the surface of a film formed on the $Mg_xZn_{1-x}O$ substrate in which the c-axis has an off-angle in the m-axis direction.

Meanwhile, setting the inclination angle θ in Part (b) of FIG. 5 too large makes the steps of the step surfaces 1b too large, and this prevents the crystal from growing flat. FIGS. 9 and 10 show how flatness of a growth film changes depending on an angle of inclination in them-axis direction. FIG. 9 shows a case where a ZnO-based semiconductor is grown on the main surface of an $Mg_xZn_{1-x}O$ substrate having an off-angle of a 1.5° inclination angle θ. On the other hand, FIG. 10 shows a case where a ZnO-based semiconductor is grown on the main surface of an $Mg_xZn_{1-x}O$ substrate having an off-angle of a 3.5° inclination angle θ. FIGS. 9 and 10 are both images after the crystal growth, obtained by scanning with a resolution of 1 μm by using an AFM. In the case of FIG. 9, the widths of the steps are kept constant, and a film is neatly formed. In the case of FIG. 10, on the other hand, unevenness exists throughout the substrate, whereby the flatness is lost. The above result shows that it is preferable to set the inclination angle θ to be 3° or less in a range of more than 0° (0<θ≦3). Accordingly, since the same can be said of the inclination angle $\Phi_m$ shown in FIG. 3, it is optimal to set the inclination angle $\Phi_m$ to be 3° or less in a range of more than 0° (0<$\Phi_m$≦3).

As described above, it is most optimal to incline the C surface being the main surface only in the m-axis direction and to set the inclination angle to be 3° or less in a range of more than 0°. In actuality, however, it is difficult to cut the crystal out so as to incline the main surface in only the m-axis direction. In the production technique, it is necessary to allow the main surface to be inclined in the a-axis as well, and to set the allowance for the inclination. For example, as shown in FIG. 3, the +c-axis on the main surface may be inclined by $\Phi_m$ toward the m-axis and by $\Phi_a$ toward the a-axis. In other words, the main surface may be formed such that the +C surface is inclined by $\Phi_m$ toward the m-axis and by $\Phi_a$ toward the a-axis. In this regard, the inventors have experimentally confirmed that, in such a case, the angle $\theta_s$ formed by each step edge of the step surface and the m-axis direction needs to be in a certain range.

To form a flat film, the step edges need to be regularly arranged in the m-axis direction. Irregular intervals of the step edges and distorted step edge lines prevent the lateral growth mentioned above, and accordingly a flat film cannot be formed.

Figure 6:
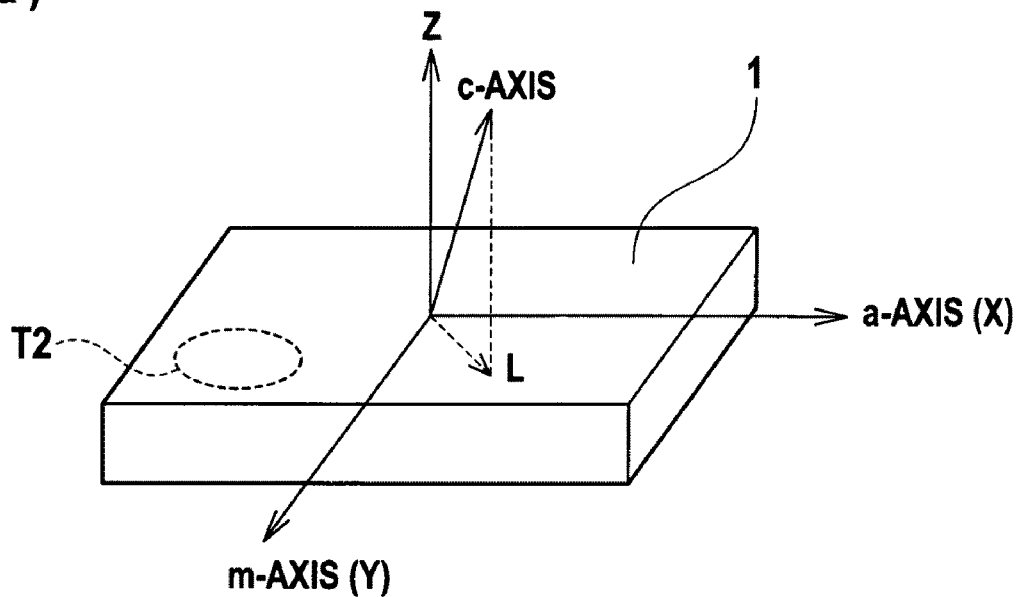
FIG. 6 is a diagram showing the $Mg_xZn_{1-x}O$ substrate surface in which the c-axis has an off-angle in the m-axis direction as well as in an a-axis direction.
Figure 6:
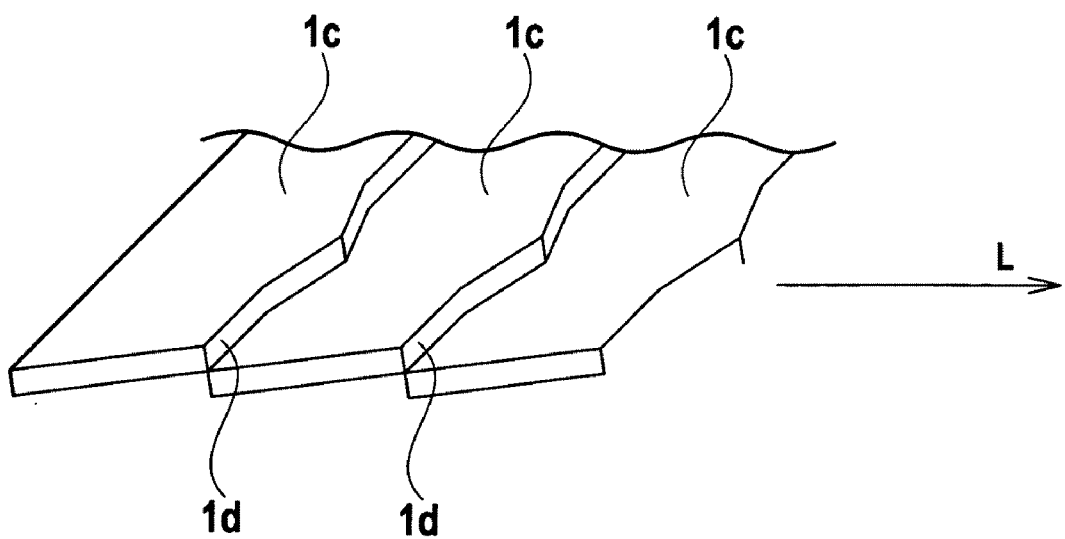

The state shown in FIG. 3 where the main surface in which the c-axis is inclined in the m-axis direction and in the a-axis direction can be expressed as shown in Part (a) of FIG. 6. The settings of the coordinate axes are the same as in FIG. 5. As shown in Part (a) of FIG. 6, the direction in which the c-axis is projected on the X-Y plane is expressed as an L direction, and Part (b) of FIG. 6 shows an enlarged view of a surface portion (T2 region, for example) of the substrate 1. Terrace surfaces 1c being flat surfaces and step surfaces 1d are formed. The step surfaces 1d are formed at step portions formed by the inclination. Here, the terrace surfaces 1c are the C surface (0001). The terrace surfaces 1c are not parallel to, but inclined from the X-Y plane, and citing FIG. 3, the c-axis perpendicular to the terrace surfaces 1c is inclined from the Z-axis by $\theta°$.

Since the terrace surfaces 1c are inclined not only in the m-axis direction but also in the a-axis direction, the step surfaces are formed diagonally, and the step surfaces 1d are arranged in the L direction. This is expressed as the arrangement of the step edges in the m-axis direction, as shown in FIGS. 3 and 4. However, the diagonal steps are not neatly formed depending on the inclination angle $\theta_a$ in the a-axis direction because the M surface is a stable surface thermally and chemically. As shown in Part (b) of FIG. 6, the step surfaces 1d are uneven, and therefore the arrangement of the step edges is distorted. As a result, a flat film cannot be formed on the main surface.

Figure 11:
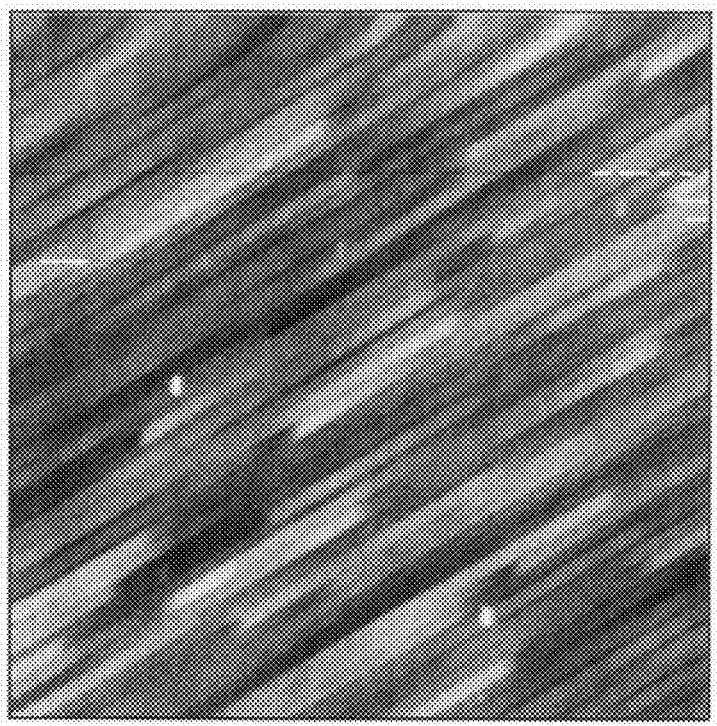
FIG. 11 is a view for showing a thermal stability of an M surface by comparing an A surface and the M surface.
Figure 11:
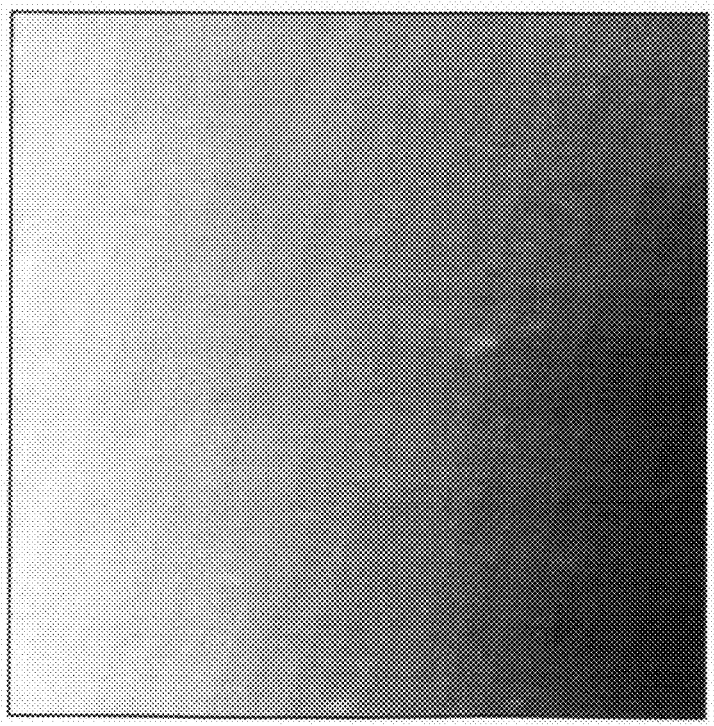
Figure 12:
FIG. 12 is a view for showing a chemical stability of the M surface.
Figure 12:
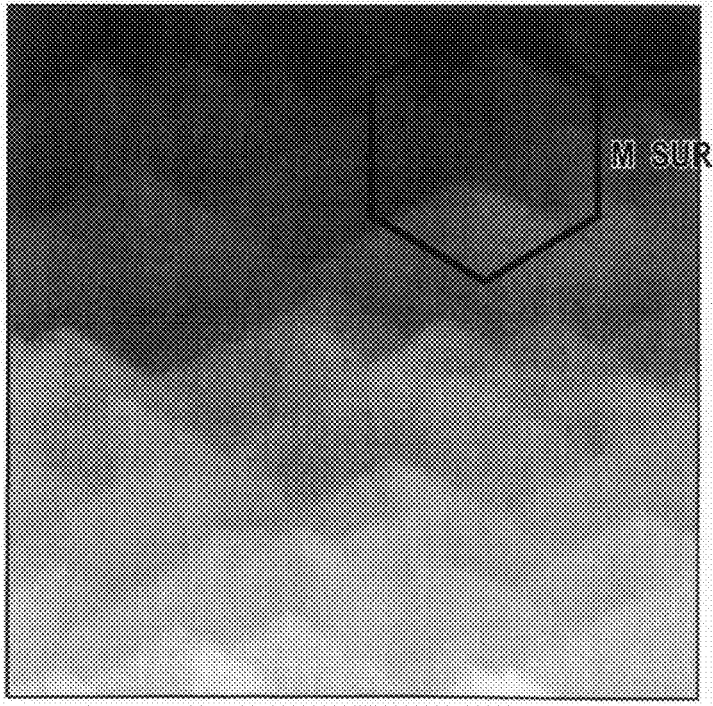
Figure 13:
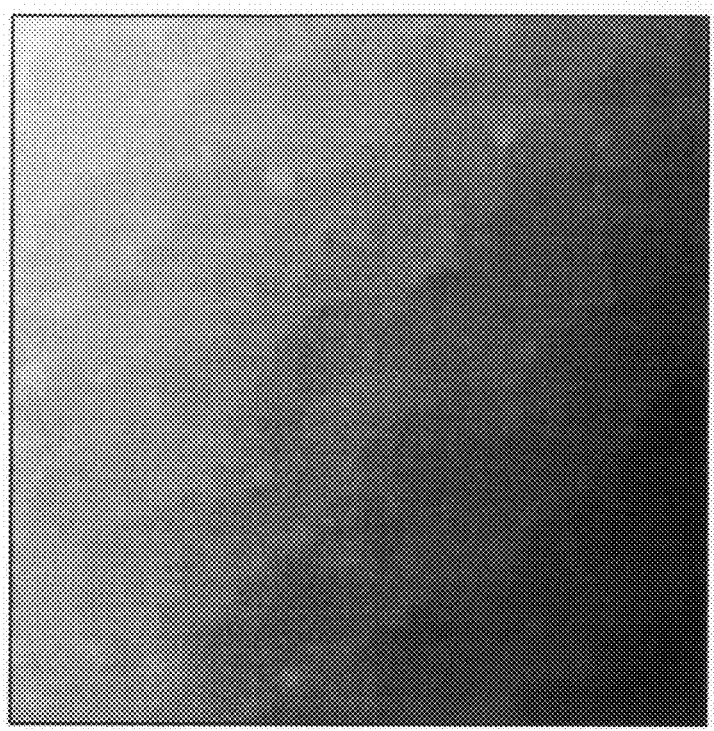
FIG. 13 is a view for showing a chemical stability of the M surface.
Figure 13:
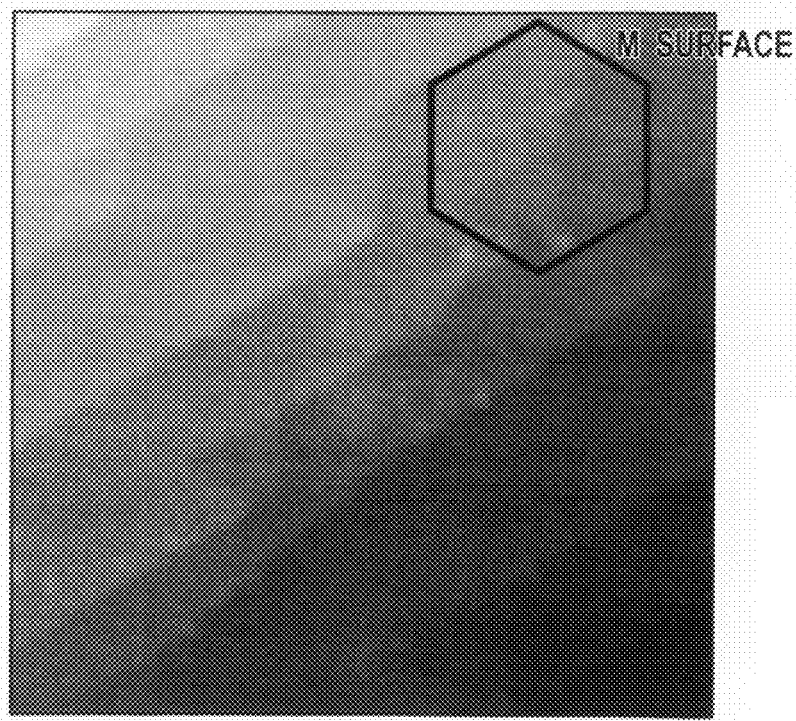
Figure 14:
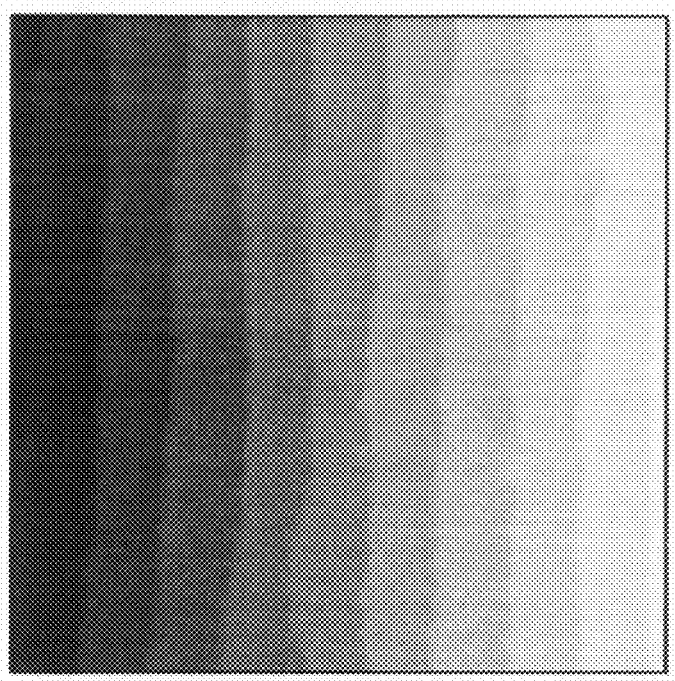
FIG. 14 is a view for showing a chemical stability of the M surface.
Figure 14:
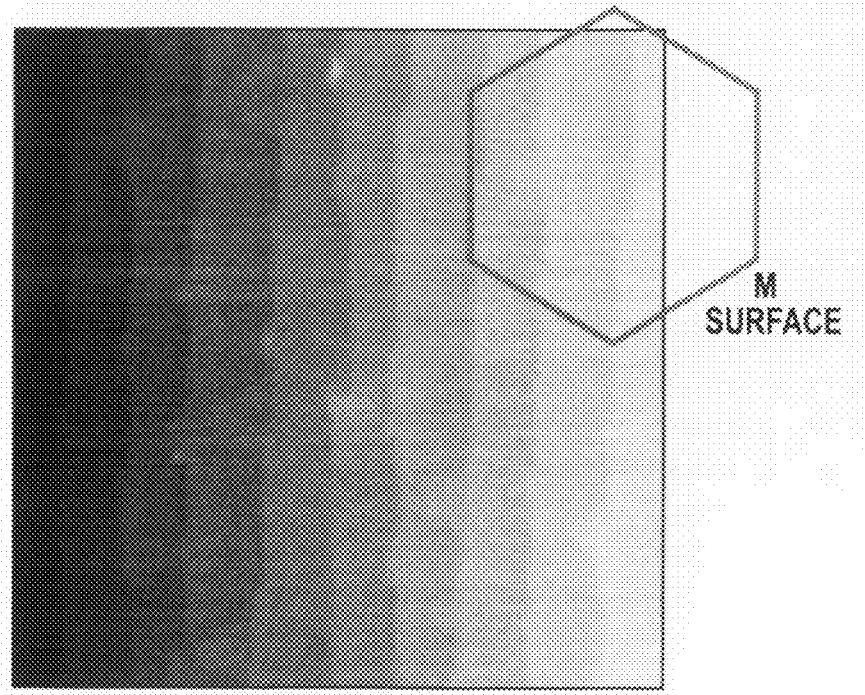

The inventors have found out that, the foregoing M surface is stable thermally and chemically, and data providing the grounds therefor are shown in FIGS. 11 to 14. FIG. 11 shows an image obtained by scanning the surface of an $Mg_xZn_{1-x}O$ substrate with a resolution of 5 μm by using an AFM. FIGS. 12 to 14 show images obtained by scanning with a resolution of 1 μm.

Part (a) of FIG. 11 shows a state after the exposed A surface of the $Mg_xZn_{1-x}O$ substrate is annealed for two hours at 1000° C. in the atmosphere. Part (b) of FIG. 11 shows a state after the exposed M surface of the $Mg_xZn_{1-x}O$ substrate is annealed for two hours at 1000° C. in the atmosphere. In Part (b) of FIG. 11, a surface is neatly formed. In Part (a) of FIG. 11, on the other hand, the surface condition is poor. Specifically, in Part (a) of FIG. 11, the step bunching is observed, and step widths and the step edges are distorted. It can be seen from the above that the M surface is a stable surface thermally and chemically.

Part (a) of FIG. 12 shows a surface condition as shown in Part (b) of FIG. 6 where the c-axis of the main surface of the $Mg_xZn_{1-x}O$ substrate is inclined in the a-axis direction as well as in the m-axis direction, and the M surface does not clearly appear. Part (b) of FIG. 12 shows a state where the surface in such a condition has been subjected to a 30-second etching with hydrochloric acid having a 5% concentration. As can be seen in the hexagonal region shown in Part (b) of FIG. 12, surfaces other than the M surface are removed by the etching with hydrochloric acid, and the M surface now particularly appears. In addition, Part (a) of FIG. 13 shows a surface of an $Mg_xZn_{1-x}O$ substrate inclined in the a-axis direction by a different angle from Part (a) of FIG. 12. Part (b) of FIG. 13 shows a state where the surface in such a condition has been subjected to a 30-second etching with hydrochloric acid having a 5% concentration. As can be seen in the hexagonal region shown in Part (b) of FIG. 13, surfaces other than the M surface are removed, and the M surface now particularly appears.

On the other hand, Part (a) of FIG. 14 shows a surface condition as shown in Part (c) of FIG. 5 where the c-axis of the main surface of the $Mg_xZn_{1-x}O$ substrate is inclined only in the m-axis direction, and shows that the step edges on the M surface are arranged to be perpendicular to the m-axis. Part (b) of FIG. 14 shows a state where the surface in such a condition has been subjected to a 30-second etching with hydrochloric acid with a 5% concentration. It can be seen from Part (b) of FIG. 14 that little change occurs in the surface condition even after the etching. From the data shown in FIGS. 12 to 14, it can be understood that the M surface is a stable surface thermally and chemically.

Figure 7:
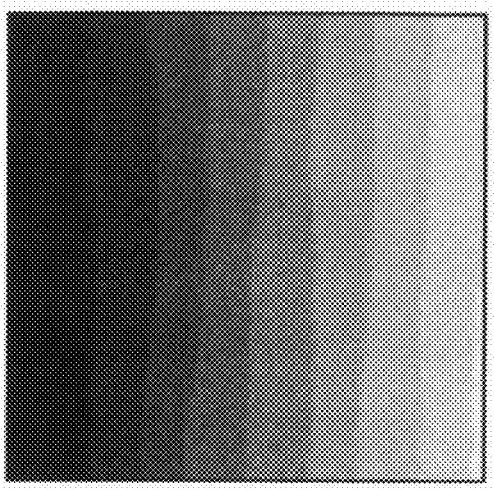
FIG. 7 is a view showing how the surface condition of the $Mg_xZn_{1-x}O$ substrate changes depending on the off-angle of the c-axis in the m-axis direction and in the a-axis direction.
Figure 7:
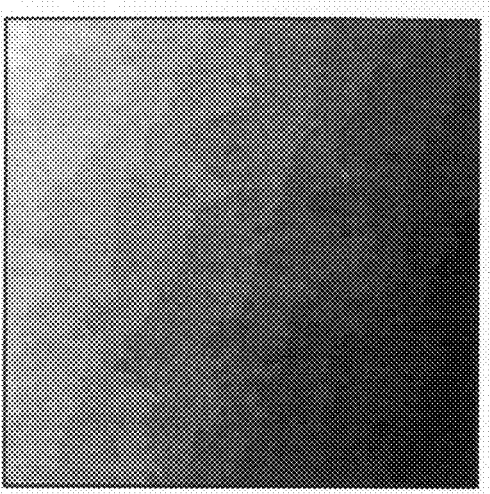
Figure 7:
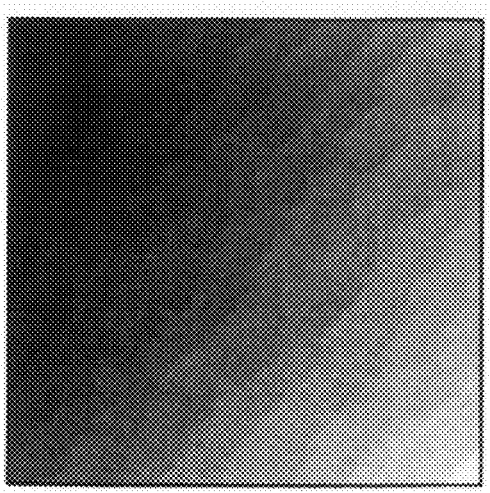
Figure 7:
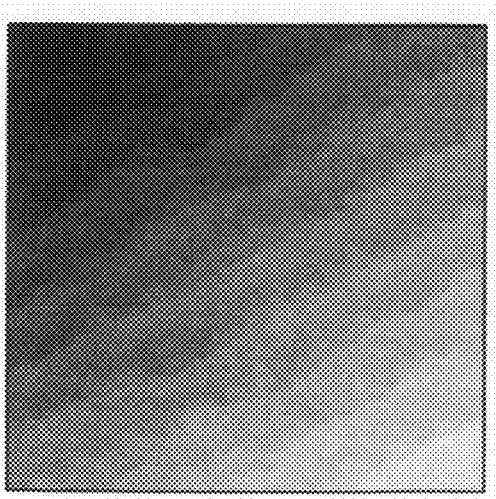

FIG. 7 shows, as described above, a surface of an $Mg_xZn_{1-x}O$ substrate in which the c-axis of the main surface has an inclination angle (off-angle) in at least the m-axis direction and also has a certain off-angle in the a-axis direction. The surface image of the $Mg_xZn_{1-x}O$ substrate was taken using an AFM. Part (a) of FIG. 7 shows a state in which the C surface being the main surface is inclined only in the m-axis direction and not in the a-axis direction. Parts (b) to (d) of FIG. 7 each show a case where the C surface is inclined not only in the m-axis direction but also in the a-axis direction. In each of Parts (b) to (d) of FIG. 7 showing the surface condition, the inclination angle in the a-axis direction is made larger and larger.

Figure 8:
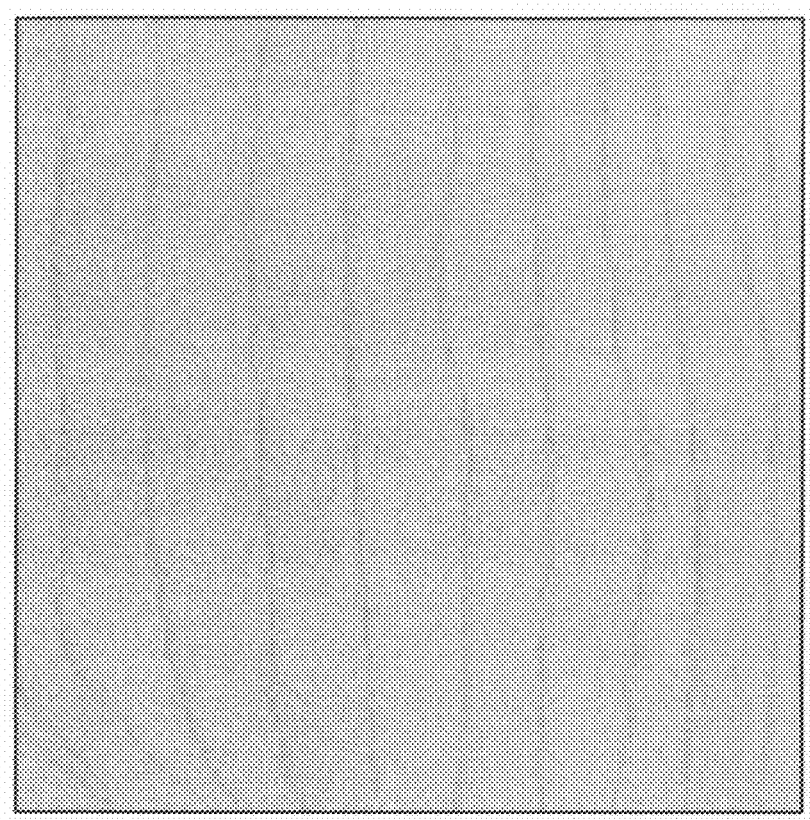
FIG. 8 is a view showing the surface of a film formed on the $Mg_xZn_{1-x}O$ substrate in which the c-axis has an off-angle in the m-axis direction.
Figure 8:
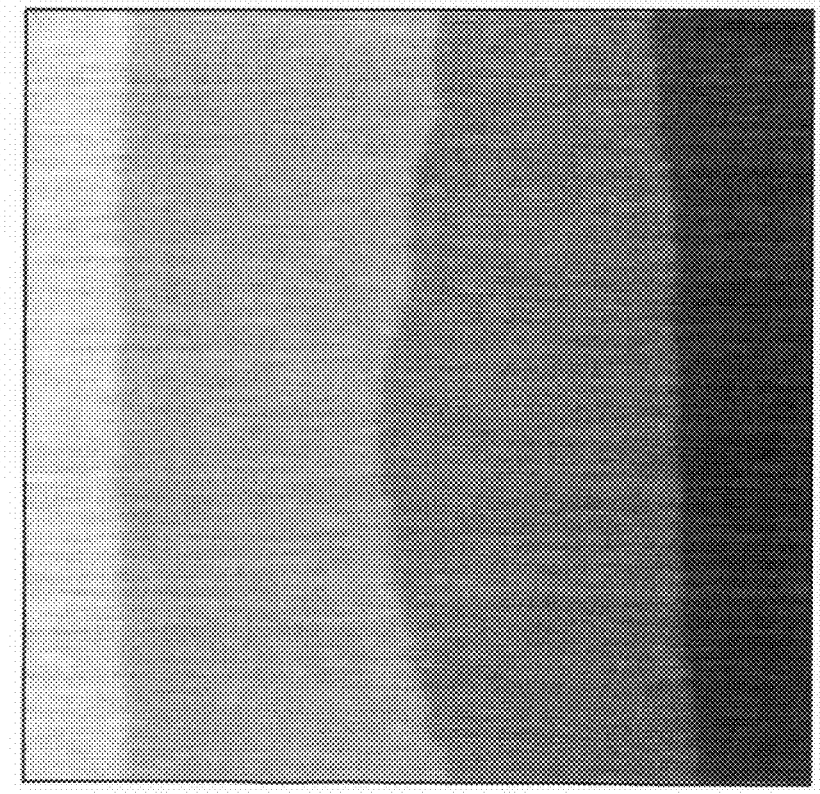

Part (a) of FIG. 7 shows a condition of the surface inclined only in the m-axis direction by 0.3°. Part (a) of FIG. 7 shows an excellent surface condition, and the step edges appear as being regularly arranged. FIG. 8 shows an example in which ZnO-based semiconductor layers are epitaxially grown on, for example, the $Mg_xZn_{1-x}O$ substrate of Part (a) of FIG. 7. Part (a) of FIG. 8 is an image obtained by scanning the surface after the epitaxial growth in 3 μm of resolution by using an AFM. Part (b) of FIG. 8 is an image obtained by scanning the surface in 1 μm of resolution. The surface condition is excellent, and unevenness is not observed throughout the surface.

However, causing the c-axis to have an off-angle also in the a-axis direction leads to uneven step edges and irregular step widths, which negatively affects the film formation.

Figure 16:
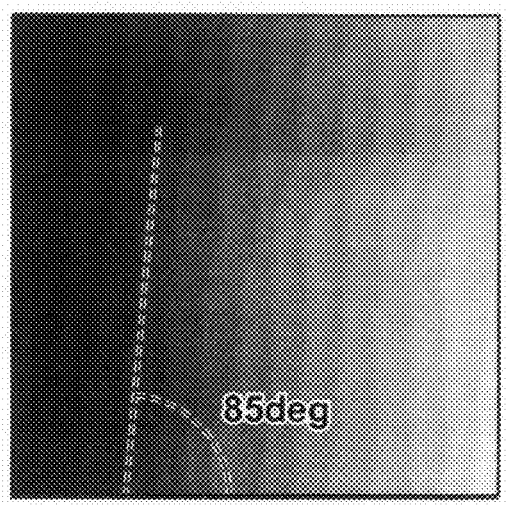
FIG. 16 is a view showing the surface condition of the $Mg_xZn_{1-x}O$ substrate in which the c-axis has a different off-angle in the a-axis direction.
Figure 16:
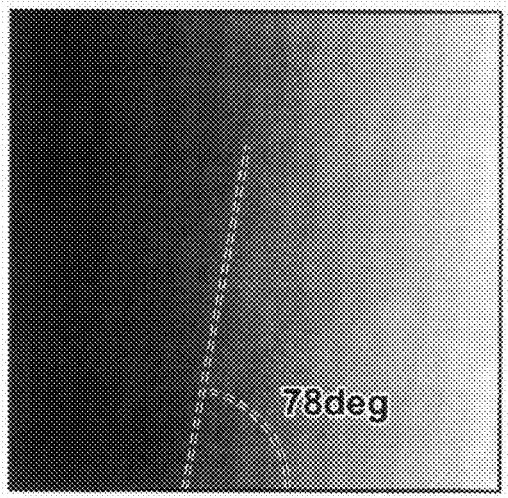
Figure 16:
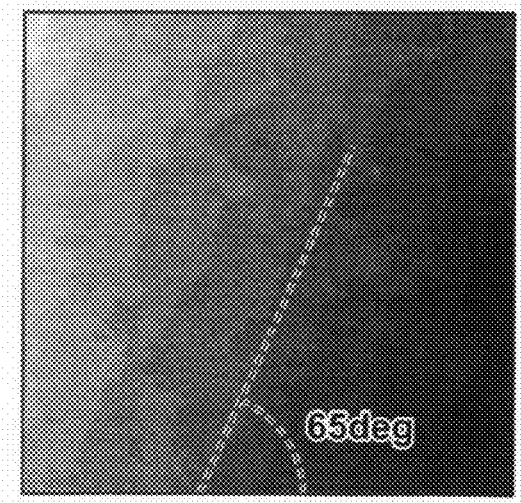

FIG. 16 shows how the step edges and the step widths change when the C surface being the growth surface (main surface) has an off-angle not only in the m-axis direction, but also in the a-axis direction. Comparison was made by fixing the off-angle $\Phi_m$ in the m-axis direction to 0.4°, and by changing the off-angle $\Phi_a$ in the a-axis direction to get larger, the off-angles $\Phi_m$ and $\Phi_a$ being what have been described in FIG. 3. The changing of the off-angle $\Phi_a$ was achieved by changing the cut-off surface of the $Mg_xZn_{1-x}O$ substrate.

Figure 19:
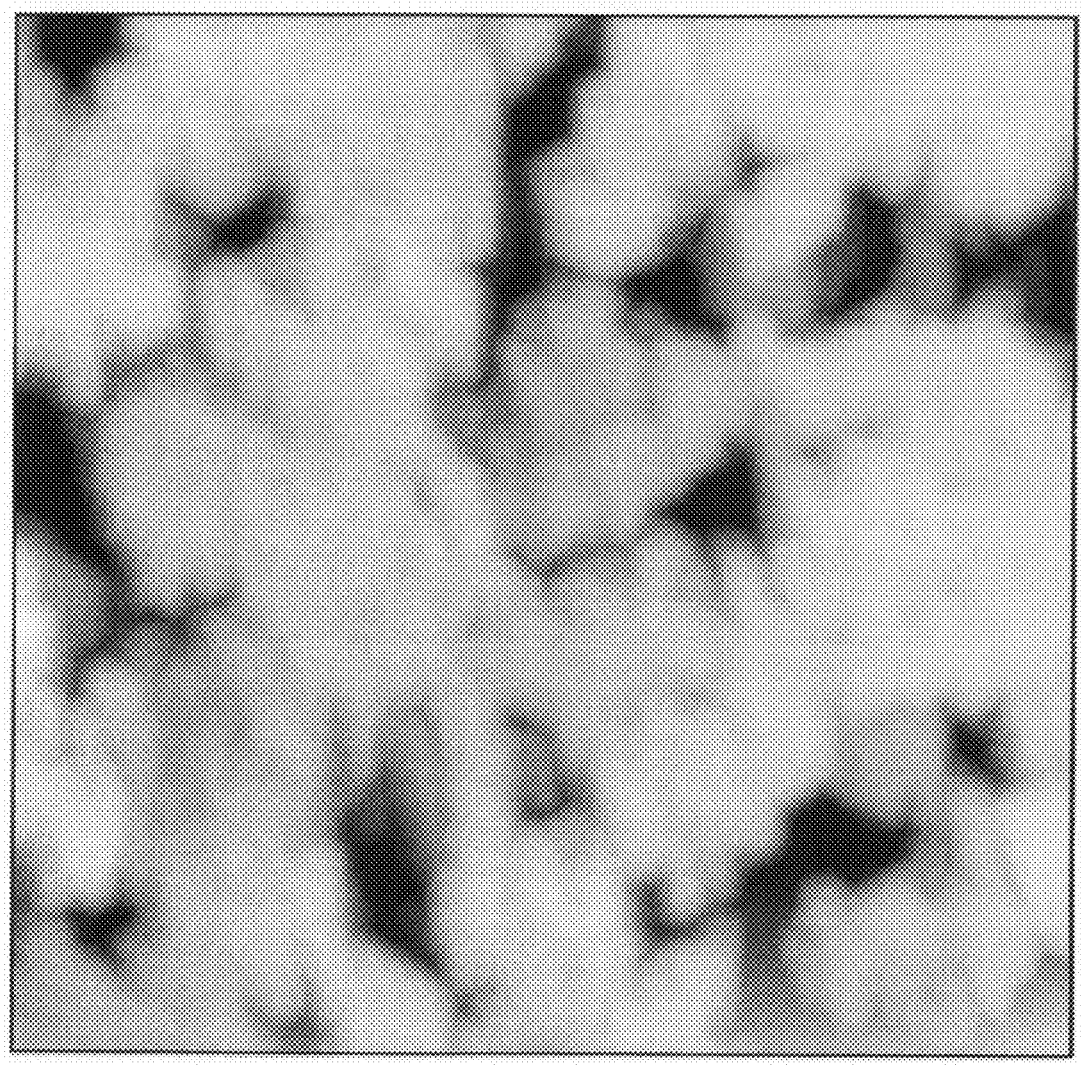
FIG. 19 is a view showing a surface obtained by further laminating semiconductor layers on the surface of Part (b) of FIG. 18.

When the off-angle $\Phi_a$ in the a-axis direction is changed to be large, the angle $\theta_s$ formed by the step edge and the m-axis direction is changed to be large. To show this, the angle $\theta_s$ is shown in each of the images of FIG. 16. Part (a) of FIG. 16 shows a case of $\theta_s=85°$. In this case, neither the step edges nor the step widths are distorted. Part (b) of FIG. 16 shows a case of $\theta_s=78°$. In this case, although somewhat distorted, the step edges and the step widths can be observed. Part (c) of FIG. 16 shows a case of $\theta_s=65°$. In this case, the step edges and the step widths are greatly distorted, and cannot be observed. If ZnO-based semiconductor layers are epitaxially grown on such a surface as that shown in Part (c) of FIG. 16, a film as shown in FIG. 19 is formed. In the case shown in Part (c) of FIG. 16, in terms of the inclination $\Phi_a$ in the a-axis direction, the inclination corresponds to 0.15°. It can be seen from the data given above that it is preferable that $70° \leq \theta_s \leq 90°$.

Meanwhile, what needs to be considered is not only the case of the $\Phi_a$ degree inclination in the a-axis direction of the c-axis direction of the main surface, but also the case of the inclination in a −Y direction in FIG. 3, because these are equivalent due to the symmetric property. When the step portions formed at the step surfaces are projected on the X-Y plane, with the inclination angle in the −Y direction being set as $-\Phi_a$, it can be expressed as shown in Part (b) of FIG. 4. Here, as the condition for an angle $\theta_i$ formed by the m-axis and the step edge, the above mentioned $70° \leq \theta_s \leq 90°$ is also valid. Since the relationship, $\theta_s = 180° - \theta_i$ is established, the maximum value for $\theta_s$ is $180° - 70° = 110°$. Ultimately, the range $70° \leq \theta_s \leq 110°$ is the condition for growing a flat film.

To form a flat film, it has been found out that the inclination in the a-axis direction of the c-axis of the growth surface on the $Mg_xZn_{1-x}O$ substrate should preferably be in the range satisfying $70° \leq \theta_s \leq 90°$. Next, if $\theta_s$ is expressed based on FIG. 3 by using $\Phi_m$ and $\Phi_a$ with the unit of an angle being the radian (rad), the following is obtained. From FIG. 3, an angle α is expressed as:

$$\alpha = \arctan(\tan \Phi_a / \tan \Phi_m); \text{ and}$$

$$\theta_s = (\pi/2) - \alpha = (\pi/2) - \arctan(\tan \Phi_a / \tan \Phi_m).$$

Here, the following is obtained by converting the unit of $\theta_s$ from radian to degree (deg):

$\theta_s = 90 - (180/\pi)\arctan(\tan \Phi_a / \tan \Phi_m)$. Therefore, it can be expressed as:

$70 \leq \{90 - (180/\pi)\arctan(\tan \Phi_a / \tan \Phi_m)\} \leq 110$. Here, as is already well known, tan is the tangent, and arctan is the arctangent. Note that, when $\theta_s = 90°$ is the case, the c-axis is inclined not in the a-axis direction, but only in the m-axis direction.

Next, a description will be given of a method of manufacturing the ZnO-based semiconductor device shown in FIG. 1 by forming an inclination on the surface on the lamination side of the $Mg_xZn_{1-x}O$ substrate 1.

Firstly, the $Mg_xZn_{1-x}O$ substrate 1 is formed into a wafer by the following method. Specifically, an ingot of ZnO formed by, for example, a hydrothermal synthesis method is cut off so that, as described above, the +c-axis of the main surface may be inclined at least in the m-axis direction, more specifically, so that the +C surface (0001) may be inclined in the m-axis direction by 2° or less in a range of more than 0°. Additionally, when the +c-axis has an off-angle in the a-axis direction in addition to the inclination in the m-axis direction, the off-angle is to have an inclination of a certain range. Specifically, when the +c-axis has an inclination also in the a-axis direction, $\theta_s$ shown in FIG. 3 is set to be in a range from 70° to 90°. Then, the cut-off surface is polished by CMP (chemical mechanical polish). In this way, the wafer is formed.

Meanwhile, even if the substrate 1 has an Mg mixed crystal ratio of O, there is little influence on the crystallinity of the ZnO-based semiconductor grown on the substrate 1. However, it is preferable to employ a material having a band gap larger than the wavelength of light to be emitted (composition of an active layer) because then the emitted light is not absorbed by the substrate 1.

An MBE apparatus is used to grow the ZnO-based compound. The MBE apparatus has a radical source that generates oxygen radical in which the reaction activity of oxygen gas is enhanced by RF plasma. A radical source of the same type is also prepared for nitrogen being a dopant for p-type ZnO. A Zn source, an Mg source, a Ga source (n-type dopant) is supplied from a Knudsen cell (evaporation source) by using, respectively, a metal Zn, a metal MG, and the like with a purity of 6N (99.9999%) or more. A shroud in which liquid nitrogen flows is provided around an MBE chamber so that wall surfaces may not be heated by heat radiation from the cell and a substrate heater. This allows the inside of the chamber to be kept at a high vacuum of about $1 \times 10^{-9}$ Torr.

The above-described wafer (substrate 1) formed of ZnO having been polished by CMP is set in such a MBE apparatus, and then is subjected to thermal cleaning at a temperature of about 700° C. to 900° C. Thereafter, the substrate temperature is changed to be about 800° C., and the ZnO-based semiconductor layers 2 to 6 are then sequentially grown.

Here, a semiconductor lamination part 7 shown in FIG. 1 consists of the light emitting layer formation part 6 and the p-type ZnO contact layer 5 having a film thickness of about 10 nm to 30 nm, for example. However, an example given here is a simple structure, and the lamination structure is not limited to the above.

The light emitting layer formation part 6 is formed to have a double-hetero structure in which the active layer 3 is sandwiched between the n-type layer 2 and the p-type layer 4 which are made of $Mg_yZn_{1-y}O$ ($0 \leq y \leq 0.35$, for example, y=0.25) having a band gap wider than the active layer 3. Although not illustrated, the active layer 3 is formed to have a multiple quantum-well (MQW) structure having a lamination structure of, from the lower side: an n-type guide layer made of n-type $Mg_zZn_{1-z}O$ ($0 \leq z \leq 0.35$, for example, z=0.2) and having a thickness of about 0 nm to 15 nm; a lamination part in which an $Mg_{0.1}Zn_{0.9}O$ layer having a thickness of about 6 nm to 15 nm and a ZnO layer having a thickness of 1 nm to 3 nm are alternately laminated for six sets; and a p-type guide layer made of p-type $Mg_{0.1}Zn_{0.9}O$ and having a thickness of about 0 nm to 15 nm. The active layer 3 is formed so as to emit light having a wavelength of, for example, about 365 nm. However, the structure of the light emitting layer formation part 6 is not limited to the example given above. For example, the active layer may have a single quantum-well (SQW) structure or a bulk structure, and a p-n structure of a single-hetero junction may be used instead of the double-hetero junction. Further, each of the n-type layer 2 and the p-type layer 4 may have a lamination structure consisting of a barrier layer and a contact layer. In addition, a gradient layer may be provided between layers of a hetero junction. Moreover, a reflection layer may be formed on a substrate side.

Next, the back surface of the substrate 1 is polished so that the substrate 1 may have a thickness of about 100 µm. Then, the n-electrode 9 is formed by laminating Ti and Al on the back surface by a method such as a vapor deposition method or sputtering. Here, the ohmicity of the n-electrode 9 is ensured by sintering the lamination at 600° C. for about 1 minute. Further, the p-electrode 8 is formed on a surface of the p-type contact layer 5 by a lift-off method in a lamination structure of Ni/Au formed by a method such as a vapor deposition method or sputtering. The wafer is then divided into chips, for example, by dicing, so that the light emitting device having the structure shown in FIG. 1 is formed. Note that the n-side electrode 9 may be formed not on the back surface of the substrate 1, but on a surface of the n-type layer 2 exposed by etching a part of the laminated semiconductor lamination part 7.

Although an LED has been taken as an example in the above description, the present invention may also be applied to a laser diode (LD). Also in such a case, the C surface on the growth surface of an $Mg_xZn_{1-x}O$ substrate as a growth substrate is similarly inclined by an angle set in the range described above. Thereby, flatness of each of the ZnO-based semiconductor layers laminated on the substrate can be maintained, and thus a semiconductor laser having a high quantum effect can be manufactured.

Figure 17:
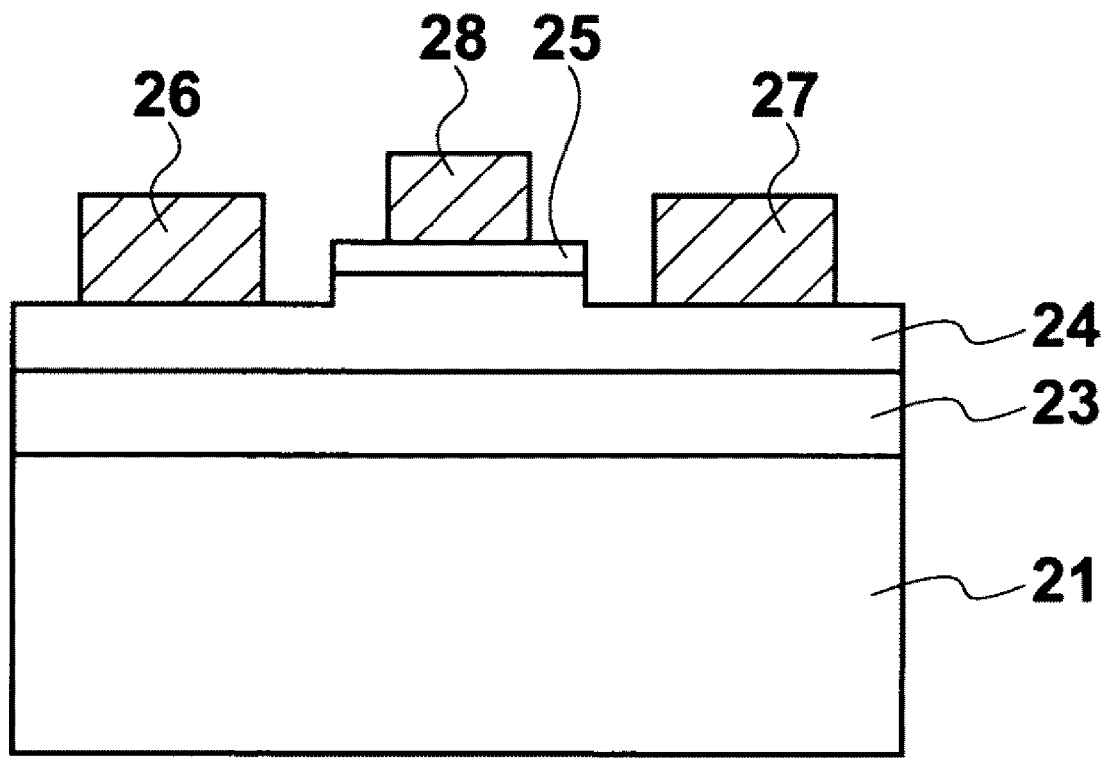
FIG. 17 is a diagram showing an example of a cross-section structure of a transistor formed according to the present invention.
Figure 18:
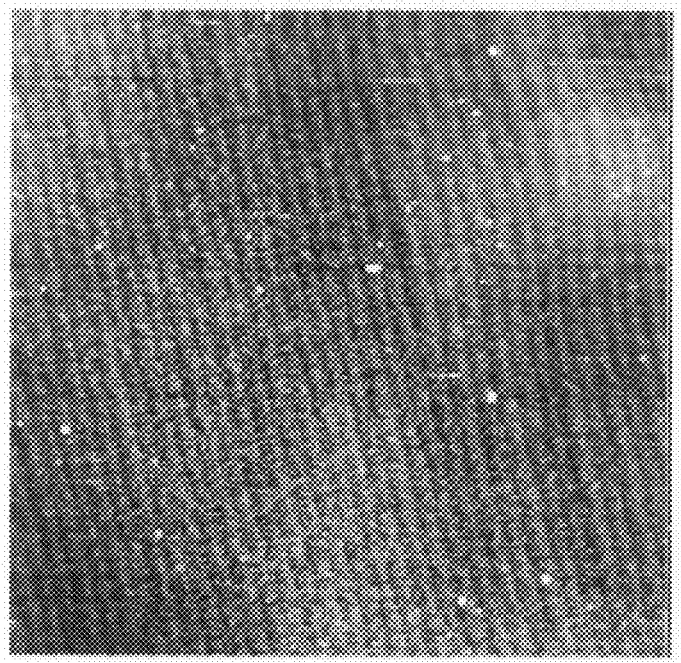
FIG. 18 is a view showing the surfaces of a growth substrate in which films are formed on the −C surface and the +C surface, respectively.
Figure 18:
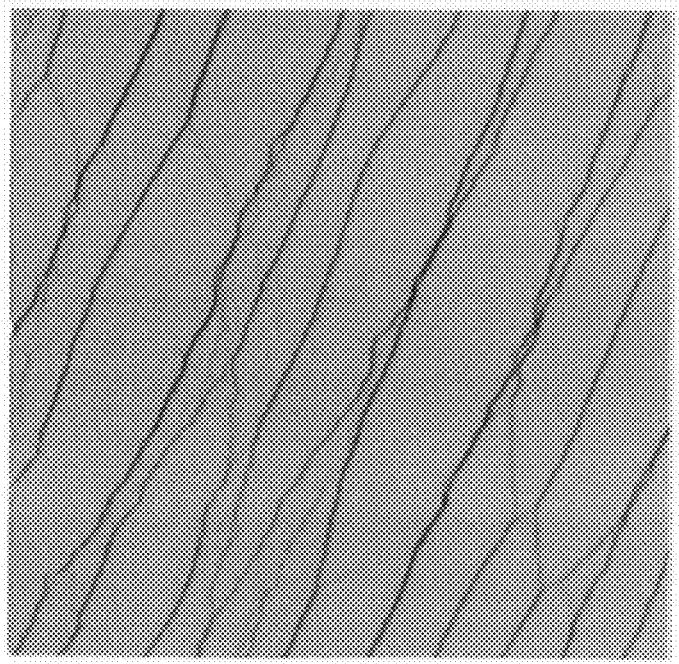

FIG. 17 is a diagram showing a cross-section structure of a transistor formed by growing ZnO-based semiconductor layers on a ZnO substrate 1, the main surface on the laminating direction side of which is the C surface (0001) being inclined not only in the m-axis direction but also in the a-axis direction. In this example, an undoped ZnO layer 23, an n-type MgZnO-based electron transit layer 24, and an undoped MgZnO-based layer 25 are sequentially grown to have thicknesses of about 4 μm, 10 nm, and 5 nm, respectively. The electron transit layer 24 is exposed by removing the undoped MgZnO-based layer 25 by etching, with an about 1.5-μm width to be a gate length being left unetched. Then, a source electrode 26 and a drain electrode 27 are formed on the electron transit layer 24 thus exposed by etching. Here, the source electrode 26 and the drain electrode 27 are each formed with, for example, a Ti film and an Al film. Then, a gate electrode 28 is formed on a surface of the undoped MgZnO-based layer 25 by laminating, for example, a Pt film and an Au film. Thereby, the transistor is formed.

In the device configured as above, the film flatness of each of the semiconductor layers formed on the ZnO substrate 1 is improved, so that a transistor with a high switching speed (HEMT) is obtained.

The invention claimed is:

1. A ZnO-based semiconductor device, characterized in that
   in an $Mg_xZn_{1-x}O$ ($0 \leq x < 1$) substrate having a C surface as its main surface, a c-axis is inclined by $\Phi_m$ degree at least in an m-axis direction,
   the $\Phi_m$ satisfies a condition being $0 < \Phi_m \leq 3$, and
   a ZnO-based semiconductor layer is formed on the main surface.

2. The ZnO-based semiconductor device according to claim 1, characterized in that
   a +C surface constitutes the C surface.

3. The ZnO-based semiconductor device according to claim 1, characterized in that
   the c-axis of the main surface is inclined by $\Phi_a$ degree in an a-axis direction, and
   the $\Phi_a$ satisfies a condition of $70 \leq \{90 - (180/\pi)\arctan(\tan \Phi_a / \tan \Phi_m)\} \leq 110$.

4. The ZnO-based semiconductor device according to claim 2, characterized in that
   the c-axis of the main surface is inclined by $\Phi_a$ degree in an a-axis direction, and
   the $\Phi_a$ satisfies a condition of $70 \leq \{90 - (180/\pi)\arctan(\tan \Phi_a / \tan \Phi_m)\} \leq 110$.

* * * * *